United States Patent
Kosugi

[11] Patent Number: 6,101,202
[45] Date of Patent: Aug. 8, 2000

[54] SEMICONDUCTOR LASER MODULE

[75] Inventor: Tomonari Kosugi, Tokyo, Japan

[73] Assignee: NEC Corporation, Tokyo, Japan

[21] Appl. No.: 09/327,585

[22] Filed: Jun. 8, 1999

Related U.S. Application Data

[63] Continuation of application No. 08/831,365, Mar. 31, 1997, Pat. No. 5,995,525.

[30] Foreign Application Priority Data

Mar. 29, 1996 [JP] Japan .................................. 8-103847

[51] Int. Cl.$^7$ ...................................................... H01S 3/043
[52] U.S. Cl. ............................................ 372/36; 372/109
[58] Field of Search ............................... 372/36, 109, 108

[56] References Cited

U.S. PATENT DOCUMENTS 5,093,838  3/1992  Kubota ..................... 372/107
5,420,722  5/1995  Bislak ...................... 359/708

FOREIGN PATENT DOCUMENTS 03120884  5/1991  Japan ....................... 372/36

*Primary Examiner*—James W. Davie
*Attorney, Agent, or Firm*—Ostrolenk, Faber, Gerb & Soffen, LLP

[57] ABSTRACT

It is an object of the invention to provide a thinned semiconductor laser module. The semiconductor laser module is provided with a module package, an inverted L-shaped lens supporting member, composed of a horizontal upper part and a vertical under part, where a corner thereof defines a boundary therebetween, a substrate fixed to an under surface of the vertical under part of the lens supporting member, a temperature regulation element, the under surface of which is fixed on an interior bottom surface of the module package and the upper surface of which is fixed to the under surface of a substrate a semiconductor laser for emitting a laser beam, being fixed to a portion near a side-end of a substrate, an optical fiber, an end of which is fixed on a point irradiated by the laser beam on a side wall of the module package, and a lens, which is fixed on the under surface of the horizontal upper part of the lens supporting member, or optically coupling the semiconductor laser with the optical fiber, and the lowest end of the lens is set lower than the upper surface of the substrate.

6 Claims, 2 Drawing Sheets

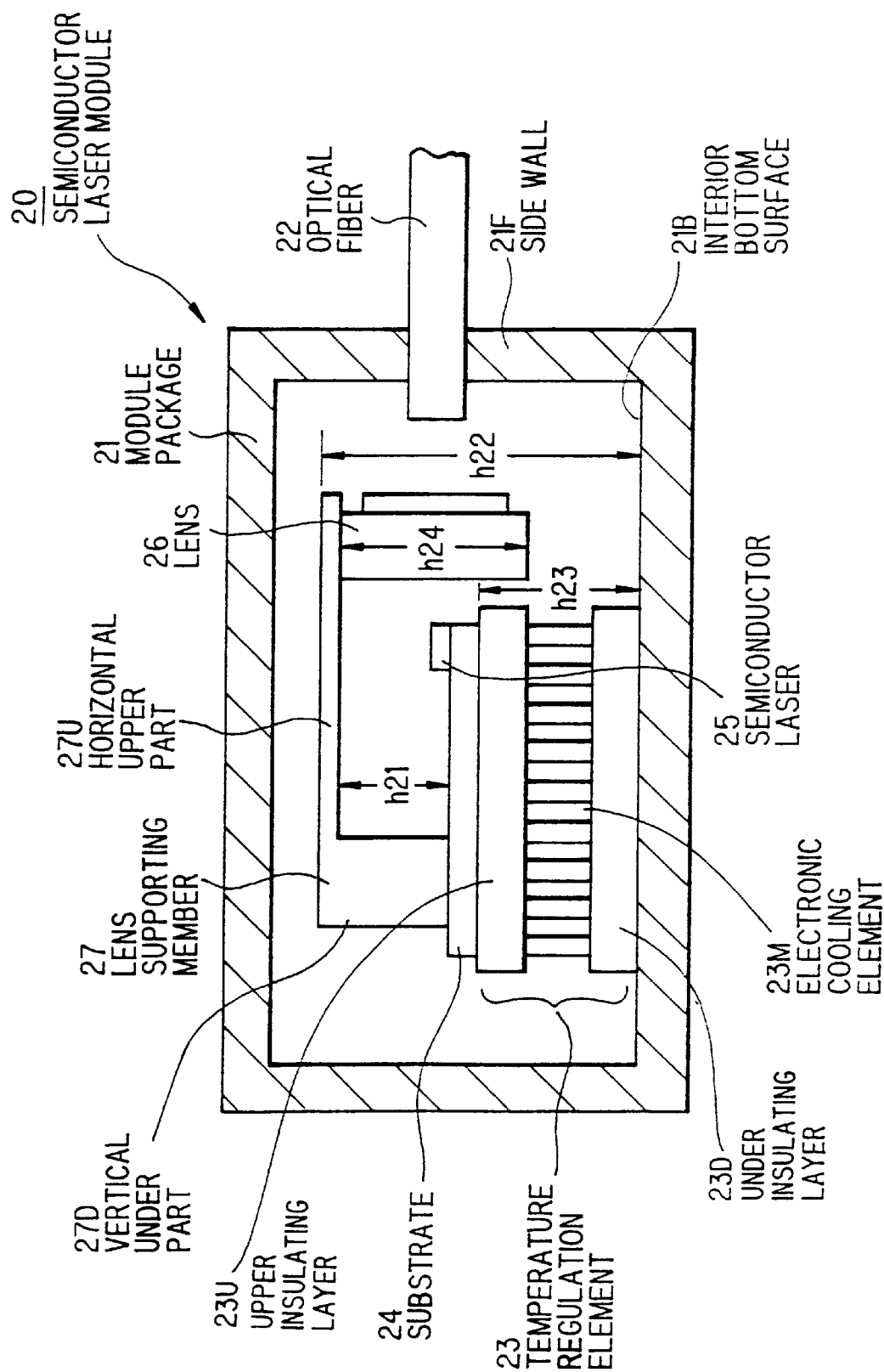

SEMICONDUCTOR LASER MODULE

This is a continuation of application Ser. No. 08/831,365, filed Mar. 31, 1997, now U.S. Pat. No. 5,995,525.

FIELD OF THE INVENTION

The invention relates to a semiconductor laser module suited for an optical communication or an optical data processing, and especially to a semiconductor laser module provided with a temperature regulation element for cooling itself and a lens for coupling a laser beam emitted from a semiconductor laser with an optical fiber.

BACKGROUND OF THE INVENTION

The semiconductor laser module is widely used as a light-source of an optical signal in an optical fiber transmission apparatus. In recent years, down-sizing of the optical transmission apparatus is progressing, and the highly integrated configuration of a circuit board is earnestly required. Accordingly, various circuit elements to be implemented on the circuit board have come to he miniaturized and the heights of them have become low. In view of the recent tendency in the circuit elements, the semiconductor laser module is required especially to be thinner. Although considerable efforts have been made on the aforementioned subject by engineers of optelectronics, further improvements are extremely desirable.

SUMMARY OF THE INVENTION

Accordingly, it is an object of the intention to provide a a semiconductor laser module, the height of which is so low that it becomes possible to further decrease the thickness of an optelectronic circuit comprising a semiconductor laser module by avoiding the limitation on the height of the same due to that of a lens, and is sufficiently reliable in the aspect of mechanical strength, in spite of its decreased thickness.

According to the first feature of the invention, a semiconductor laser module, comprises:

- a module package,
- an inverted L-shaped lens supporting member, composed of horizontal upper and vertical under parts,
- wherein its corner portion defines a boundary between the horizontal upper and vertical under parts,
- a substrate fixed to an under surface of the vertical under part,
- a temperature regulation element, having an under surface fixed to an interior bottom surface of the module package and an upper surface fixed to an under surface of the substrate,
- a semiconductor laser for emitting a laser beam, fixed on an upper surface of the substrate near side-end thereof,
- an optical fiber, an input end of which is fixed to a point on a side wall of the module package, on which the laser beam is focused, and
- a lens, which is fixed to an under surface of the horizontal upper part near a side-end thereof and optically couples the semiconductor laser with the optical fiber,
- wherein a lowest end of the lens is lower than an upper surface of the substrate.

In other words, a semiconductor laser module according to the invention comprises a substrate provided with a semiconductor laser fixed on its upper surface near its side-end, a temperature regulation element fixed to an under surface of the substrate, an extending member extending overhead the substrate and reaching a predetermined point beyond the side-end of the substrate, a lens supporting member including a basic part fixed on the substrate and supporting the extending member, and a lens having the highest end fixed to an under surface of the extending member near its side-end and optically coupling the semiconductor laser with an optical fiber in its package, and has a feature that the lowest end of the lens is lower than the upper surface of the substrate. It should be noted that the substrate is made of metal with high thermal conductivity. Accordingly, the height of the highest end of the lens can be greatly decreased as compared with that of the conventional semiconductor laser module.

According to the second feature of the invention, a semiconductor laser module, comprises:

- a laser light source for emitting a laser light, the laser light source being mounted on a first support member;
- a lens for focusing the laser light on a predetermined point, the lens being supported by a second support member; and
- an optical fiber having an input and positioned at the predetermined point to be supplied with the laser light focused by the lens,
- wherein the lens is positioned between the laser light source and the input end of the optical fiber to be off a tip end of the first support member.

BRIEF DESCRIPTION OF THE DRAWINGS

The invention will be explained in more detail in conjunction with the appended drawings, wherein:

FIG. 2 shows the outline of the structure of a semiconductor laser module, according to the invention.

DESCRIPTION OF THE PREFERRED EMBODIMENTS

Figure 1:
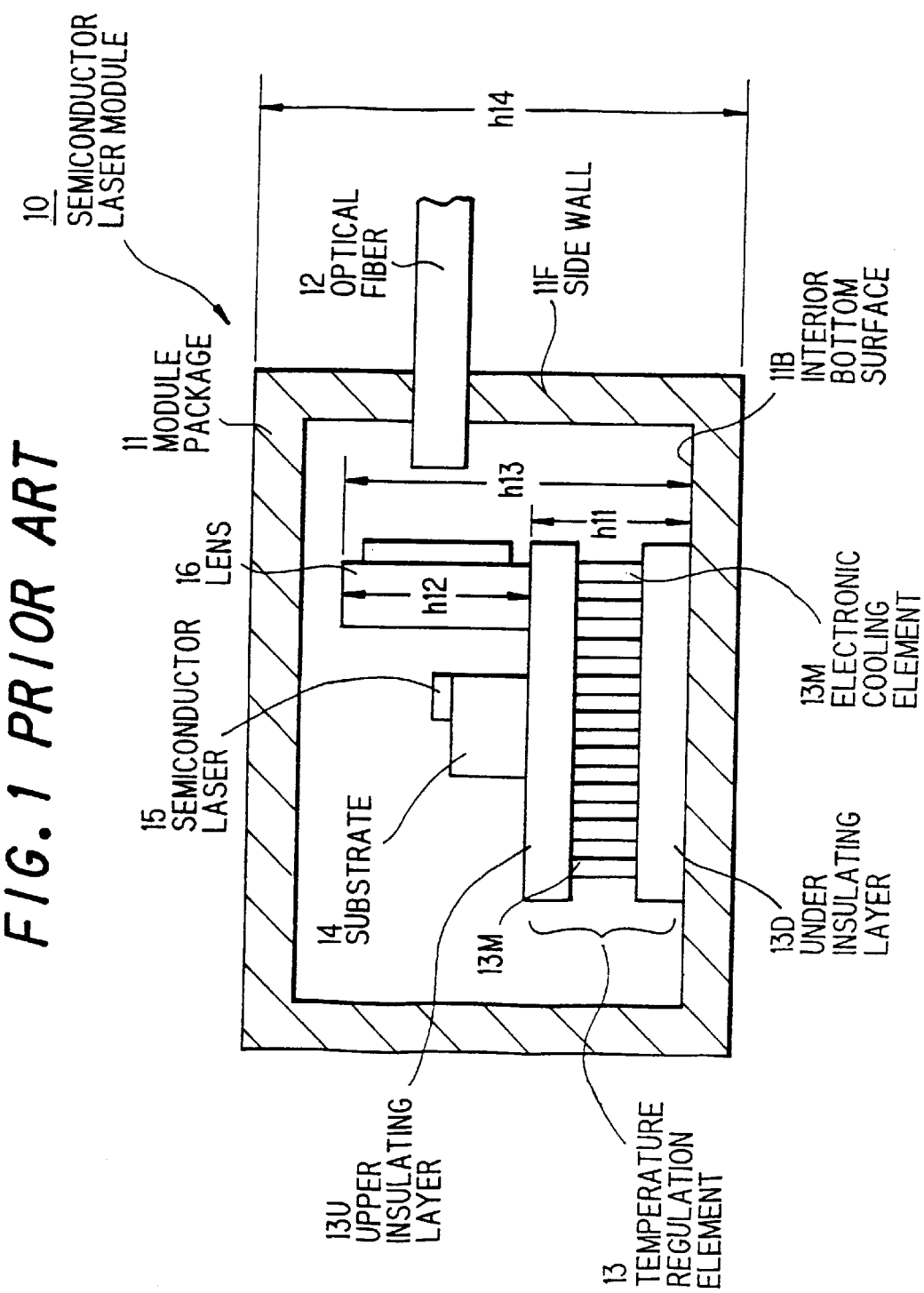
FIG. 1 shows the outline of the structure of a conventional semiconductor laser module, designed for decreasing its thickness.

Before explaining a semiconductor laser module according to the invention in the preferred embodiment, the aforementioned conventional semiconductor laser module will be explained. FIG. 1 shows the structure of a conventional semiconductor laser module disclosed in Japanese Patent Kokai No. 4-355706 for obtaining a thinner configuration.

In FIG. 1, the input end of an optical fiber 12 for transmitting an optical signal is fixed on the side wall 11F of the module package 11 of the semiconductor laser module 10 by means of YAG-laser-welding. A temperature regulation element 13 is fixed on the interior bottom surface 11B of the module package 11 by soldering. After respectively forming metallic conducting patterns, being either thin or thick, on surfaces of upper and lower insulating plates 13U and 13D, the temperature regulation element 13 is fabricated by holding several numbers of electronic cooling elements 13M, such as pertier cooling elements, between the insulating plates 13U and 13D, and fixing the electronic cooling elements 13M to the aforementioned metallic conducting patterns by soldering, where the electronic cooling elements 13M are connected in series. On the upper surface of the upper insulating plate 13U of the temperature regulation element 13, two kinds of the metallic patterns (not shown) are formed by means of evaporation or plating. A semiconductor laser 15 is fixed on the aforementioned metallic pattern formed by gold, solder or etc. plating via a substrate 14 by means or soldering. Moreover, a lens 16 for optically coupling a laser beam emitted from the semiconductor laser 15 with the optical fiber 12 is fixed on another kind of a metallic pattern, being several tens μm thick and made of Ni with little impurity content, by means of YAG-laser-welding.

As mentioned in the above, in the conventional semiconductor laser module 10, the height of the highest point of the total structural elements h13 is given by as the sum of that of the temperature regulation element 13 h11 and that of the lens 16 h12. The height of the module package 11 h14 is determined by h13. The height of the module package 11 is decreased by adopting the metallic pattern for fixing the lens 16 by means of YAG-welding, instead of a substrate.

However, following disadvantages have been pointed out on the structure of the conventional semiconductor laser module shown in FIG. 1.

The first disadvantage is that, the height of the laser module 10 h14 is limited by the heights of the structural elements in the module package 11 (the height of the temperature regulation element 13 h11 and that of the lens 16 h12). That is to say, the height of the total structural elements in the module package 11 cannot be lower than the sum of the height of the temperature regulation element 13 h11 and that of the lens 16 h12 in principle.

The reason is that the lens 16 is positioned on the upper surface of the upper insulating plate 13U of the temperature regulation element 13.

The second disadvantage is that the lens 16 is directly fixed on the metallic pattern on the upper surface of the upper insulating plate 13U of the temperature regulation element 13 by means of YAG-laser-welding. However, it is very difficult to fix the lens 16 on the metallic pattern formed or the upper surface of the upper insulating plate 13U by means of YAG-laser-welding, as compared with the case that the lens 16 is fixed on a metallic plate by the same means. Then, there arises uncertainty on reliability of the mechanical strength of a YAG-laser-welded portion.

The reason is that the metallic plate, on which the lens is fixed, is replaced by a metallic pattern.

Next, the embodiment of the invention will be explained referring to the appended drawing. In an embodiment of the invention shown in FIG. 2, a semiconductor laser module 20 comprises a module package 21, a inverted L-shaped lens supporting member 27 composed of a horizontal upper part 27U and a vertical under part 27D, where a corner portion defines a boundary therebetween, a substrate 24 fixed to an under surface of the vertical under part 27D of the lens supporting member 27, a temperature regulation element 23, the under surface of which is fixed on an interior bottom surface 21B of a module package 21 by soldering for instance, and the upper surface of which is fixed to the under surface of the substrate 24 by soldering for instance, a semiconductor laser 25 fixed on the upper surface of the substrate 24 and emitting a laser beam, an optical fiber 22 having a fixed input end at a point on a side wall 21F, on which the laser beam in the module package 21 is focused, and a lens 26, which is fixed to the under surface of the horizontal upper part 27U of the lens supporting member 27 and optically couples the semiconductor laser 25 with the optical fiber 22.

In the embodiment of the invention, the lens is not fixed on the upper surface of the substrate 24, but on the under surface of the horizontal upper part 27U of the lens supporting member 27, and the vertical under part 27D of the lens supporting member 27 is fixed on the upper surface of the substrate 24. The substrate 24 is fixed on the upper surface of the temperature regulation element 23 by soldering. It should be noted that the substrate is made of metal with high thermal conductivity.

As mentioned in the above, in the preferred embodiment of the invention shown in FIG. 2, the lowest end of the lens can be lower than the upper surface of the substrate 24 and the height of the highest end of the lens 26 from the interior bottom surface 21B of the module package 21 can be greatly decreased as compared with that of the conventional semiconductor laser module, by adopting such a structure that the lens is fixedly suspended from the side-end of the horizontal upper part 27U, which is higher than the semiconductor laser 25.

Moreover, in the embodiment of the invention shown in FIG. 2, the lowest end of the lens 26 faces the interior bottom surface 21B of the module package 21 with a predetermined interval. Then, a direct heat conduction does not arise between the lens 26 and the module package 21, and deterioration of cooling ability of the semiconductor laser module can be prevented.

The temperature regulation element 23 for cooling the semiconductor laser 25 by electronic means is composed of plural electronic cooling elements 23M which are provided between upper and under insulating layers 23U and 23D. It is permissible that the temperature regulation element 23 can serve as not only means for cooling, but also as that for heating at need, where a part or all of the electronic cooling elements 23M operate as heating elements.

A similar effect can be obtained by a modified structure, in which the vertical under part 27D of the lens supporting member 27 is fixed on the temperature regulation element 23 (on its upper surface, for instance), in stead of fixing the under surface of the vertical under part 27D of the lens supporting member 27 on the substrate 24.

Hereafter, the embodiment of the invention will be explained in more detail, in conjunction with the appended drawings.

FIG. 2 shows the structure of a semiconductor laser modules according to the invention as a preferred embodiment. In the semiconductor laser module 20 shown in FIG. 2, the end of an optical fiber 22 to be supplied with an optical signal is fixed on an point on the wall 21F of a module package 21 by means of YAG-laser-welding.

On an interior bottom surface 21B of a module package 21, a temperature regulation element 23, composed of pertier elements or etc., is fixed by soldering. On the upper surface of the temperature regulation element 23, a substrate is fixed by soldering. Near a side-end of the substrate 24, a semiconductor laser 25 is fixed by soldering.

A lens 26 for optically coupling laser beam emitted by the semiconductor laser 25 with the optical fiber 22 is fixed on the under surface of the horizontal upper part 27U preferably by means of YAG-laser-welding. On the upper surface of the substrate 24, the under surface of the vertical under part 27D of the lens supporting member 27 is fixed by means of YAG-laser-welding.

The optical axis of the lens 25 is so set that it coincides with a laser beam emitted from the semiconductor laser 25, and the lowest end of the lens 26 faces the interior bottom surface 21B in non-contacting condition. Moreover, the height of the point on which the input end of the optical fiber 22 is fixed, is the same as that of the active layer of the semiconductor laser 25.

In the semiconductor laser module 20 with the above mentioned structure, the semiconductor laser 25 is optically coupled with the optical fiber 22 via the lens 26. Heat generated in the semiconductor laser 25 is absorbed by the temperature regulation element 23 via the substrate 24, and thereby the temperature of the semiconductor laser 25 is kept within a desirable value.

Moreover, in the semiconductor laser module 20 in the aforementioned embodiment, the lens supporting member 27 is fixed on the upper surface of the substrate 24, and the height h22 of the highest point of the whole structural elements assembled in the module package 21 can be greatly decreased as compared with the simple sum of the height h23 of the temperature regulation element 23 and the vertical dimension h24 of the lens 25 by suitably selecting the height h21 of the vertical under part 27D of the lens supporting member 27.

Accordingly, the degree of freedom in selecting structural elements, such as a temperature regulation element and etc. in the module package 21, can be increased, an moderate margins can be obtained in the performance of the apparatus and reliability of the structural elements. Moreover, the height of the semiconductor laser module 20 can be greatly decreased by establishing the limiting values of various circuit elements.

As described in the above, the lens is not fixed on the substrate, but on the under surface of the horizontal upper part of the lens supporting member, and the vertical under part of the lens supporting member is fixed on the substrate. The substrate is fixed on the upper surface of the temperature regulation element. According to the structure mentioned in the above, the lowest end of the lens is situated at a position, being lower than the upper surface of the substrate, and the height of the highest end of the lens from the interior bottom surface of the module package can be greatly decreased as compared with that of the conventional semiconductor laser module.

Then the height of the semiconductor laser module can be greatly decreased, the invention contributes to economization and miniaturization of the transmission apparatus, and improvements of performances and reductions of dimensions of the semiconductor laser module can be promoted still more, by thinning individual structural elements.

According to the invention, the lowest end of the lens faces the interior bottom surface of the module package in non-contacting condition with a predetermined interval, and then, direct heat conduction does not arise between the lens and the module package. Accordingly, deterioration of cooling capability of the semiconductor laser module can be prevented, and further reduction of the thickness of the temperature regulation element becomes possible.

Although the invention has been described with respect to specific embodiment for complete and clear disclosure, the appended claims are not to he thus limited but are to be construed as embodying all modifications and alternative constructions that may be occurred to one skilled in the art which fairly fall within the basic teaching here is set forth.

What is claimed is:

1. A semiconductor laser module, comprising:
   a laser light source capable of emitting a laser light, said laser light source being mounted on a surface of a first support member;
   a lens focusing said laser light on a predetermined point, said lens being supported by a second support member supported on said first support member, said second support member supported on said first support member, said second support member comprising an L-shaped support having a first leg extending substantially perpendicularly from the first support and a second leg coupled to the first leg extending parallel to the surface of the first support member, the lens being supported from the second leg; and
   an optical fiber having an input end positioned at said predetermined point to be supplied with said laser light focused by said lens,
   said lens being positioned between said laser light source and said input end of said optical fiber.

2. A semiconductor laser module, comprising:
   a laser capable of emitting a laser light,
   a first support member having a surface on which said laser is mounted;
   a lens focusing said laser light on a predetermined point, a second support member extending over said laser with said lens suspended therefrom so as to be in a path of said laser light emitted from said laser, said second support member comprising an L-shaped support having a first leg extending substantially perpendicularly from the first support and a second leg coupled to the first leg extending parallel to the surface of the first support member, the lens being supported from the second leg;
   an optical fiber having an input end positioned at said predetermined point to be supplied with laser light emitted by said laser and focused by said lens.

3. A semiconductor laser module, comprising:
   a laser light source for emitting a laser light contained in a module package, the laser light source being mounted on a mounting surface disposed on an interior surface of the package;
   an optical fiber extending from an interior of said module package to an exterior thereof, said optical fiber having a laser light-input end in said interior of said module package;
   a lens for focusing said laser light to said laser light-input end of said optical fiber, said lens having an extent transverse to an optical axis of the lens greater than a distance of said laser light source from the interior surface of the module; and
   a lens supporting member for suspending said lens such that the optical axis of said lens is coincident with a line connecting said laser light source and said laser light-input end of said optical fiber, said lens supporting member being supported on a mounting surface other than said laser light source in said module package.

4. The semiconductor layer module of claim 3, wherein the lens supporting member has a first distance from the interior surface of the module, said first distance being less than a combination of the extent of said lens transverse to the optical axis and the distance of said laser light source from the interior surface of said module.

5. The semiconductor layer module of claim 4, wherein the laser light source is disposed on a mounting substrate and said distance of said laser light source from the interior surface of said module is a distance from said interior surface to a first surface of said mounting substrate closest to said interior surface.

6. The semiconductor layer module of claim 5, wherein the interior surface comprises a floor.

* * * * *